United States Patent
You et al.

(10) Patent No.: US 8,841,693 B2
(45) Date of Patent: Sep. 23, 2014

(54) LIGHT EMITTING DEVICE PACKAGE AND MANUFACTURING METHOD THEREOF

(75) Inventors: Jae Sung You, Gyeonggi-do (KR); Young Hee Song, Gyeonggi-do (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 0 days.

(21) Appl. No.: 13/427,575

(22) Filed: Mar. 22, 2012

(65) Prior Publication Data

US 2012/0292651 A1   Nov. 22, 2012

(30) Foreign Application Priority Data

May 18, 2011   (KR) .................. 10-2011-0046933

(51) Int. Cl.
| | |
|---|---|
| *H01L 33/00* | (2010.01) |
| *H01L 33/50* | (2010.01) |
| *H01L 23/00* | (2006.01) |
| *H01L 33/64* | (2010.01) |
| *H01L 33/62* | (2010.01) |
| *H01L 33/48* | (2010.01) |

(52) U.S. Cl.
CPC ............ *H01L 33/505* (2013.01); *H01L 33/62* (2013.01); *H01L 2224/48091* (2013.01); *H01L 24/32* (2013.01); *H01L 33/486* (2013.01); *H01L 33/642* (2013.01); *H01L 2933/0033* (2013.01); *H01L 33/504* (2013.01); *H01L 2224/73265* (2013.01)
USPC .................................. 257/99; 257/E33.005

(58) Field of Classification Search
CPC ..................................................... H01L 33/64
USPC .......................................................... 257/733
See application file for complete search history.

(56) References Cited

U.S. PATENT DOCUMENTS

| | | | |
|---|---|---|---|
| 7,170,151 B2 * | 1/2007 | Elpedes et al. ............ | 257/676 |
| 2004/0169451 A1 | 9/2004 | Oishi et al. | |
| 2007/0145399 A1 * | 6/2007 | Park et al. ................... | 257/98 |
| 2010/0072499 A1 | 3/2010 | Kwon et al. | |
| 2010/0213485 A1 * | 8/2010 | McKenzie et al. ......... | 257/98 |
| 2010/0237370 A1 | 9/2010 | Kim et al. | |
| 2011/0065218 A1 * | 3/2011 | Tudhope et al. ............ | 438/28 |

(Continued)

FOREIGN PATENT DOCUMENTS

| | | |
|---|---|---|
| CN | 1617362 A | 5/2005 |
| CN | 1905223 A | 1/2007 |

(Continued)

OTHER PUBLICATIONS

Weng et al., "Advanced thermal enhancement and management of LED packages," International Communications in Heat and Mass Transfer 36 (2009) 245-248.*

(Continued)

*Primary Examiner* — Victor A Mandala
*Assistant Examiner* — Christopher Johnson
(74) *Attorney, Agent, or Firm* — McDermott Will & Emery LLP

(57) ABSTRACT

There is provided a light emitting device package including: a substrate having a cavity formed therein; a heat sink provided on a bottom surface of the cavity to be adjacent to an inner wall of the cavity; a light emitting device mounted on the heat sink; and a phosphor layer provided within the cavity and covering the heat sink and the light emitting device.

21 Claims, 12 Drawing Sheets

(56) References Cited

U.S. PATENT DOCUMENTS

| | | | |
|---|---|---|---|
| 2011/0186873 A1* | 8/2011 | Emerson | 257/88 |
| 2011/0241030 A1* | 10/2011 | Kim | 257/88 |
| 2011/0260199 A1* | 10/2011 | Andrews | 257/99 |

FOREIGN PATENT DOCUMENTS

| | | |
|---|---|---|
| CN | 101809768 A | 8/2010 |
| JP | 07-283438 | 10/1995 |
| JP | 2006-339224 | 12/2006 |
| JP | 2008-034530 | 2/2008 |
| JP | 2009-259913 | 11/2009 |
| KR | 10-2008-0051341 A | 6/2008 |

OTHER PUBLICATIONS

Office Action dated Jun. 5, 2014 issued in the corresponding Chinese application No. 201210091313.3.

* cited by examiner

LIGHT EMITTING DEVICE PACKAGE AND MANUFACTURING METHOD THEREOF

CROSS-REFERENCE TO RELATED APPLICATIONS

This application claims the priority of Korean Patent Application No. 10-2011-0046933 filed on May 18, 2011, in the Korean Intellectual Property Office, the disclosure of which is incorporated herein by reference.

BACKGROUND OF THE INVENTION

1. Field of the Invention

The present invention relates to a light emitting device package and a method of manufacturing the same.

2. Description of the Related Art

A light emitting diode (LED) is a semiconductor device capable of emitting light of various colors, due to electron-hole recombination occurring at a p-n junction when a current is supplied thereto, by using compound semiconductor materials such as GaAs, AlGaAs, GaN, InGaN, AlGaInP and the like as a light source.

LEDs are environmentally-friendly, have fast response rates on the level of several nano seconds so as to be effective for a video signal stream, and are capable of being impulsively driven.

Moreover, LEDs have a color gamut of 100% or higher and the luminance and color temperature thereof may be easily adjusted according to the amount of light emitted from red, green and blue LEDs. Therefore, LEDs have been actively employed as light emitting devices in various types of light emitting apparatuses.

Particularly, of late, LEDs using nitride-based semiconductors are employed as white light sources, so they are widely applied in various fields requiring white light sources such as in the case of a keypad, a backlight, a traffic light, airport runway lights, a general lighting apparatus and the like.

The factors determining the characteristics of LEDs are color, light speed, distribution of luminous intensity, and the like.

These characteristics are primarily determined by compound semiconductor materials used in LEDs, and are secondarily affected by a package structure and a phosphor applying method.

In recent years, the primary characteristics of an LED chip itself have been rapidly enhanced, but at present, the development thereof has reached a certain level and the pace of development is slowing.

For this reason, it is necessary to develop a package having high reliability by improving light speed and the distribution of luminous intensity through the improvement of the secondary characteristics.

In order to improve light speed and distribution of luminous intensity and to manufacture a package having high reliability, an LED chip is bonded to a flat ceramic substrate having superior thermal characteristics and phosphors for manufacturing a white light source are uniformly applied to upper and side surfaces, i.e., light emitting surfaces of the LED chip using a chip label coating (CLC) method or the like.

Here, in a case in which the thickness of the applied phosphors is large, light conversion efficiency is reduced. Typically, light speed is lowered by 1% with respect to a phosphor thickness of 10 μm.

Furthermore, in a case in which the phosphor thickness is not entirely uniform, color deviation in light emitted from the LED chip occurs, resulting in a reduction of product reliability. Accordingly, a highly advanced phosphor applying technique is required, thereby resulting in a low yield, and thus product manufacturing time and costs are increased.

SUMMARY OF THE INVENTION

An aspect of the present invention provides a light emitting device package in which the thickness of phosphors applied to a light emitting device is uniform and easily adjusted to thereby reduce color deviation in light emitted from the light emitting device, whereby the reliability thereof may be improved and the manufacturing time and costs thereof may be reduced.

An aspect of the present invention also provides a light emitting device package allowing for improved yield rate of a white LED chip.

An aspect of the present invention also provides a light emitting device package having improved correlated color temperature (CCT).

According to an aspect of the present invention, there is provided a light emitting device package including: a substrate having a cavity formed therein; a heat sink provided on a bottom surface of the cavity to be adjacent to an inner wall of the cavity; a light emitting device mounted on the heat sink; and a phosphor layer provided within the cavity and covering the heat sink and the light emitting device.

The cavity may have a stepped multilayer structure.

The cavity may have different colored phosphor layers in individual layers of the stepped multilayer structure.

The cavity may have three stepped layers, each of which is selected from a red phosphor layer, a green phosphor layer or a yellow phosphor layer.

The cavity may have two stepped layers, in which a transparent resin part may be provided in a lower layer of the two stepped layers while covering the heat sink and the light emitting device, and a phosphor layer may be provided in an upper layer of the two stepped layers while covering the transparent resin part.

The cavity may have three stepped layers, in which a transparent resin part may be provided in upper and lower layers of the three stepped layers, and a phosphor layer may be provided in an intermediate layer of the three stepped layers.

The phosphor layer may have a thickness of 100 μm or less.

The heat sink may include a flange part having an edge upwardly inclined to be fixedly attached to the inner wall of the cavity; and a heat transfer part protruding upwardly from a central portion of the flange part.

The phosphor layer may be formed by mixing a plurality of phosphor materials.

The phosphor layer may include at least one film-type phosphor layer.

The cavity may have a quadrangular shape or a circular shape.

The inner wall of the cavity may be inclined.

The inner wall of the cavity may have different angles of inclination in individual layers of the cavity.

The inner wall of the cavity may be formed as a light emitting surface.

The light emitting device may be at least one of a white LED chip, a red LED chip, a green LED chip and a blue LED chip.

The light emitting device package may further include a heat conductive layer between the heat sink and the bottom surface of the cavity.

The heat sink and the inner wall of the cavity may have a space therebetween, and the space may have a transparent resin part therein.

The heat sink and the inner wall of the cavity may have a space therebetween, and the space may have a phosphor layer therein.

The light emitting device package may further include a pair of electrodes provided on upper and lower surfaces of the substrate; a plurality of via holes formed in the substrate in a vertical direction to communicate with the electrodes; and a plurality of electrode bars provided in the respective via holes to make electrical connections with the electrodes.

The light emitting device package may further include a lens unit provided on the substrate.

According to another aspect of the present invention, there is provided a method of manufacturing a light emitting device package, the method including: preparing a substrate having a cavity formed therein; disposing a heat sink on a bottom surface of the cavity by inserting the heat sink into the cavity to be adjacent to an inner wall of the cavity; mounting the light emitting device on an upper surface of the heat sink; and forming a phosphor layer within the cavity to cover the heat sink and the light emitting device.

The heat sink may include a flange part having an upwardly inclined edge and a heat transfer part protruding upwardly from a central portion of the flange part.

The cavity may be formed in an upper surface of the substrate by a hole making process using drilling.

The cavity may be formed by stacking ceramic layers having central hole portions on a flat ceramic layer.

The cavity may have a stepped multilayer structure by stacking a plurality of ceramic layers having central hole portions, whose diameters gradually increase in an upward direction, on a flat ceramic layer.

The light emitting device may be a blue LED chip, and the forming of the phosphor layer may be performed by coating a first phosphor material on the blue LED chip and dispensing a second phosphor material to cover the heat sink and the blue LED chip.

The first and second phosphor materials may have different colors.

The light emitting device may be a white LED chip, and a phosphor material may be dispensed to the cavity such that color temperature of light emitted from the white LED chip is converted.

The forming of the phosphor layer may be performed by dispensing a phosphor material to each of the stepped ceramic layers of the cavity.

The forming of the phosphor layer may be performed by coating a phosphor film formed of a phosphor material in each of the stepped ceramic layers of the cavity.

The forming of the phosphor layer may be performed by forming different colored phosphor layers in the individual ceramic layers of the cavity.

The phosphor layers may be formed by mixing a plurality of phosphor materials.

The cavity may include two stepped ceramic layers, and the forming of the phosphor layer may be performed by dispensing a transparent resin part to a lower layer of the two stepped ceramic layers, the transparent resin part covering the heat sink and the light emitting device, and dispensing a phosphor layer to an upper layer thereof, the phosphor layer covering the transparent resin part.

The cavity may include three stepped ceramic layers, and the forming of the phosphor layer may be performed by dispensing a transparent resin to a lower ceramic layer to form a first transparent resin part, dispensing a phosphor material to an intermediate ceramic layer to form the phosphor layer covering the first transparent resin part, and dispensing a transparent resin to an upper ceramic layer to form a second transparent resin part covering the phosphor layer.

The phosphor layer may be formed by mixing at least two of a red phosphor material, a green phosphor material, an orange phosphor material, and a yellow phosphor material.

The phosphor layer may be formed by selectively stacking a red phosphor layer and a green phosphor layer in each of the stepped ceramic layers.

The phosphor layer may be formed by selectively stacking a red phosphor layer, a green phosphor layer and an orange phosphor layer in each of the stepped ceramic layers.

The phosphor layer may be formed by selectively stacking a red phosphor layer, a green phosphor layer and a yellow phosphor layer in each of the stepped ceramic layers.

The heat sink may be manufactured by adjusting a height of the heat transfer part according to an orientation angle of light emitted from the light emitting device.

The method may further include disposing a heat conductive layer on the bottom surface of the cavity prior to the disposing of the heat sink.

The method may further include installing a lens unit on the substrate.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
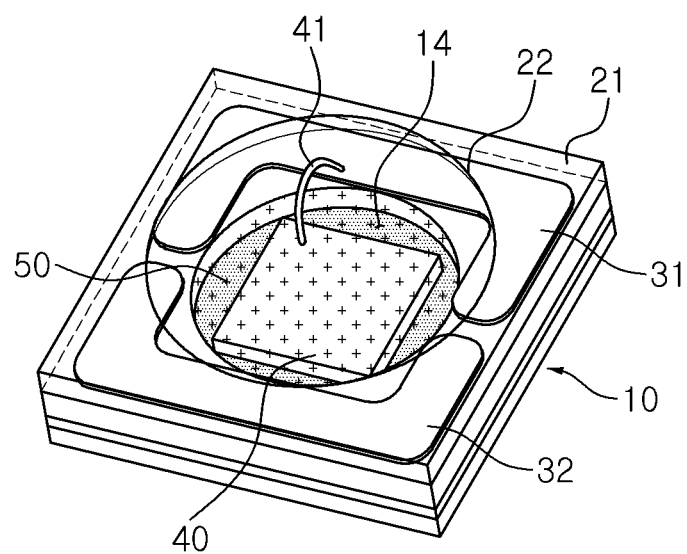
FIG. 1 is a schematic perspective view showing a light emitting device package according to an embodiment of the present invention.

Embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions may be exaggerated for clarity, and the same reference numerals will be used throughout to designate the same or like components.

Figure 2:
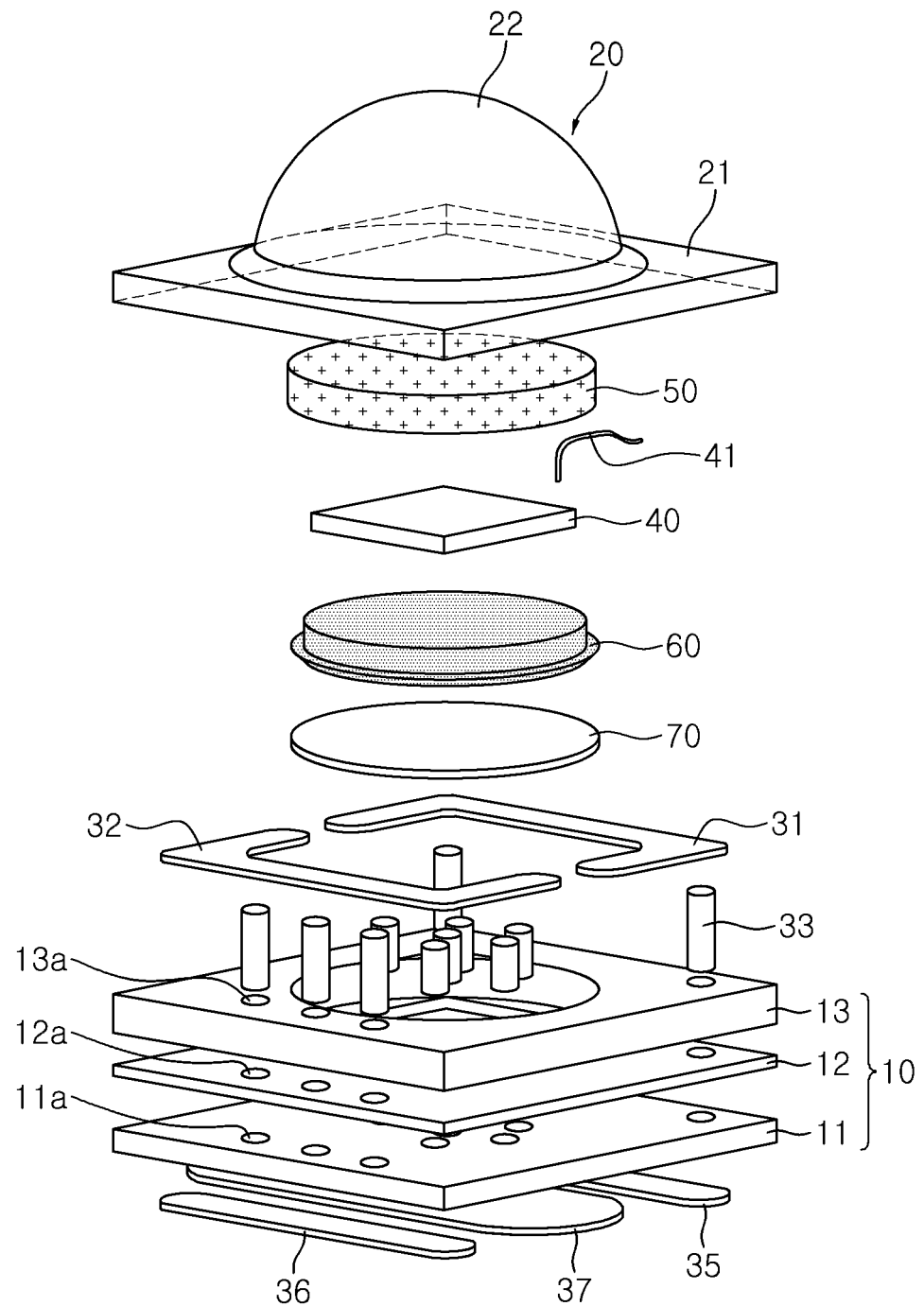
FIG. 2 is an exploded perspective view of FIG. 1.
Figure 3:
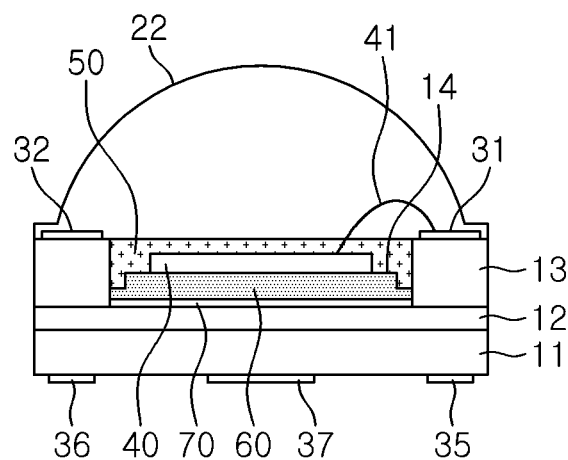
FIG. 3 is a cross-sectional view of FIG. 1.

With reference to FIGS. 1 through 3, a light emitting device package according to an embodiment of the present invention includes a substrate 10 having a cavity 14 formed therein, a heat sink 60 provided on a bottom surface of the cavity 14 of the substrate 10 to be adjacent to an inner wall of the cavity 14, a light emitting device 40 disposed on an upper surface of the heat sink 60, and a phosphor layer 50 provided within the cavity 14 and covering the heat sink 60 and the light emitting device 40.

The substrate 10, a type of a printed circuit board (PCB), may be a ceramic substrate having high thermal conductivity efficiency and easily releasing heat, generated during the operation of the light emitting device 40, outwardly. However, the invention is not limited thereto.

That is, the substrate 10 may be formed of an organic resin material containing epoxy resin, triazine resin, silicone resin, polyimide resin, or the like, other organic resin materials, a ceramic material such as AlN, $Al_2O_3$ or the like, or metals and metallic compounds.

In addition, the substrate 10 may be formed as a single body; however, the substrate 10 in the present embodiment has a stack structure in which three ceramic layers 11, 12 and 13 are stacked in order to secure various conductive patterns.

The substrate 10 provides a space such that the light emitting device 40 is mounted therein. A plurality of electrodes 31, 32, 35 and 37 may be provided on upper and lower surfaces of the substrate 10, respectively, such that they transmit electrical signals to the light emitting device 40 mounted on the substrate 10. A plurality of via holes 11a, 12a and 13a may be formed to allow the electrodes 31, 32, 35 and 36 provided on the upper and lower surfaces of the substrate 10 to communicate with each other vertically. The plurality of via holes 11a, 12a and 13a have a plurality of electrode bars 33 inserted thereinto. The electrode bars may be formed of a conductive paste or the like, such that the electrodes provided on the upper and lower surfaces of the substrate 10 are electrically connected to each other.

Here, the via holes 11a, 12a and 13a may be formed in the respective ceramic layers 11, 12 and 13 to be disposed in positions corresponding to each other. The light emitting device 40 may be electrically connected to the electrode 31 using a connective member such as a wire 41.

The electrode bar 33 may be formed of a material having high thermal conductivity efficiency, for example, a metal such as aluminum (Al), such that it may also perform heat radiation by transmitting heat generated during the operation of the light emitting device 40 to a lower portion of the substrate 10 and releasing the heat outwardly.

Figure 4:
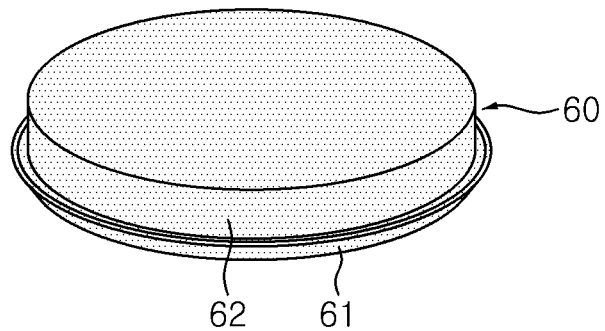
FIG. 4 is a schematic perspective view showing a heat sink of a light emitting device package according to an embodiment of the present invention.
Figure 5:
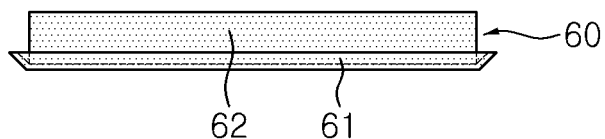
FIG. 5 is a cross-sectional view of FIG. 4.

With reference to FIGS. 4 and 5, the heat sink 60 is provided on the bottom surface of the cavity 14, and includes a flange part 61 having an edge upwardly inclined to be fixedly attached to the inner wall of the cavity 14 by being extended when being pressed from the upper side thereof and a heat transfer part protruding upwardly by a predetermined height in a central portion of the flange part 61 and releasing heat generated from the light emitting device 40 through the substrate 10. The flange part 61 and the heat transfer part 62 of the heat sink 60 may be formed of a material having high thermal conductivity, for example, a metal such as aluminum (Al).

Here, a space corresponding to a width of the flange part 61 is formed between the heat transfer part 62 of the heat sink 60 and the inner wall of the cavity 14. The space may have a transparent resin part (not shown) or the phosphor layer 50 formed therein, in order to improve product reliability by increasing coupling strength between the substrate 10 and the heat sink 60.

Here, the heat sink 60 is not limited to the upwardly inclined edge of the flange part 61. The heat sink 60 may have a different structure in which a fixing member is provided adjacent to the inner wall of the cavity 14 in order to form a space having a predetermined width between the heat transfer part 62 and the inner wall of the cavity 14.

A heat conductive layer 70 may be further formed on the bottom surface of the cavity 14 in order that it may have the heat sink 60 closely attached to an upper surface thereof and rapidly transfer heat emitted from the light emitting device 40 to the substrate 10 to thereby further enhance heat dissipation.

Here, the heat conductive layer 70 may be formed of a material having high thermal conductivity. For example, the heat conductive layer 70 may be formed of silver, epoxy or a mixture thereof; however, the invention is not limited thereto.

The light emitting device 40 according to this embodiment may employ any device as long as it can be used as a light source. A light emitting diode (LED) may be employed in light of the compactness and high light emission efficiency of the light source.

An LED is a light source producing light when a voltage is applied thereto. It is usually used in an apparatus, such as a backlight unit, requiring a white light source.

The light emitting device 40 according to this embodiment may be connected to the electrode 31 formed on the substrate 10 by a wire-bonding or flip-chip bonding method. Such an electrical connection may have various shapes.

As for such an LED, a white LED chip is usually used, but red, green and blue LED chips may also be used to thereby selectively emit light having colors corresponding thereto.

Also, red, green and blue light emitted therefrom may be mixed to produce white light. The red, green and blue LED chips may be installed and different voltages may be applied thereto so that light of a desired color, other than red, green and blue light, may be produced.

Meanwhile, white light may be produced not only by a white LED chip, but also by a combination of a monochromatic LED chip, for example, a blue LED chip, and a phosphor having a certain color.

Light emitted from the LED chip excites the phosphor such that the colors of light emitted from both the LED chip and the phosphor are combined to thereby produce white light.

For example, a blue LED chip may be used as the light emitting device 40 and a phosphor layer may be applied over the blue LED chip using a chip label coating method to thereby produce white light. Thereafter, the phosphor layer 50 may be dispensed to cover the light emitting device within the cavity to thereby implement different color temperatures.

In a case in which a white LED chip is used as the light emitting device 40, a color temperature error may easily occur due to the characteristics of the white LED chip. For this reason, the phosphor layer 50 allowing for color temperature adjustment is dispensed to the cavity 14 to thereby correct correlated color temperature (CCT), and accordingly, a yield rate is improved.

The phosphor layer 50 may be formed of a yellow phosphor, a combination of red and green phosphors, a combination of red, green and orange phosphors, a combination of red, green and yellow phosphors, or the like; however, the invention is not limited thereto.

Meanwhile, the cavity 14 of the substrate 10 may have a width and a height of the bottom surface thereof determined by considering the sizes of the heat sink 60 and the light emitting device 40 and the thickness of the phosphor layer 50.

In general, an LED chip used as the light emitting device 40 in the present embodiment is a cube-type light emitting source, allowing light to be emitted from individual surfaces thereof.

Since a large amount of light is produced from a side surface of the LED chip, a reflective member may be disposed to correspond to the side surfaces of the light emitting device 40 in order to reduce light loss, such that the path of light produced from the side surfaces of the light emitting device 40 is altered to be guided upwardly.

To enable this, the height of the inner wall of the cavity 14 is adjusted according to the size of the light emitting device 40, such that the inner wall of the cavity 14 may serve as a light reflective surface for reflection of the light emitted from the side surface of the light emitting device 40.

That is, the light emitted from the side surface of the light emitting device 40 is reflected by the inner wall of the cavity 14, and its path is changed to be guided forward, whereby light loss may be minimized.

A lens unit 20 may be further provided on the substrate 10 while covering the phosphor layer 50, to protect the phosphor layer 50, the wire and the like and form various radiation patterns.

The lens unit 20 may include a base plate 21 fixedly attached above the substrate 10 by a silicon molding, and a light transmissive part 22 formed at the center of the base plate 21. The light transmissive part 22 may be formed of a transparent or translucent material, preferably of silicon or silica, such that the light transmissive part 22 allows the light emitted from the light emitting device 40 to pass therethrough and be diffused upwardly.

The lens unit 20 may be formed by directly dispensing the transparent or translucent material to cover the substrate 10 using a mold. In the case of a large-sized lens unit, the lens unit may be separately manufactured and attached over the substrate 10 by a bonding method or the like.

In a case in which the light emitting device 40 is an LED chip having straight ability, the lens unit 20 may be upwardly convex when disposed on the substrate 10 in order to extensively diffuse light of the LED chip, which is a point light source, and to achieve light uniformity.

The cavity 14 of the substrate has a circular shape as shown in FIGS. 1 through 3. However, the cavity may have various shapes such as a square shape, a quadrangular shape or the like.

Figure 6:
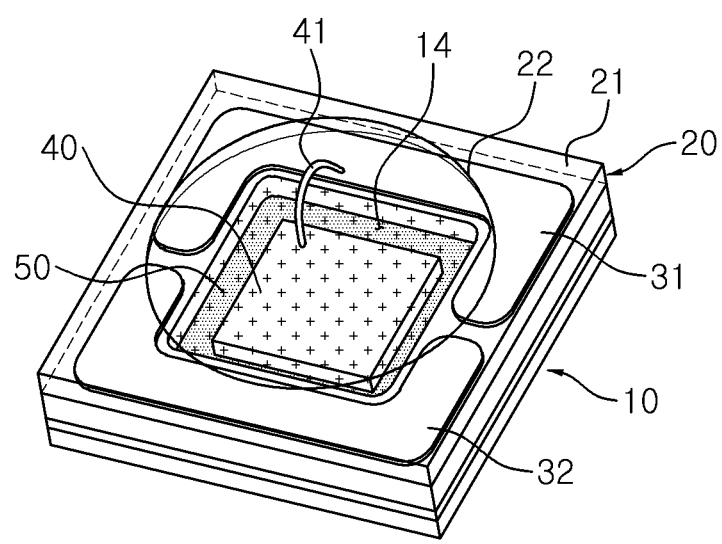
FIG. 6 is a schematic perspective view showing a light emitting device package according to another embodiment of the present invention.
Figure 7:
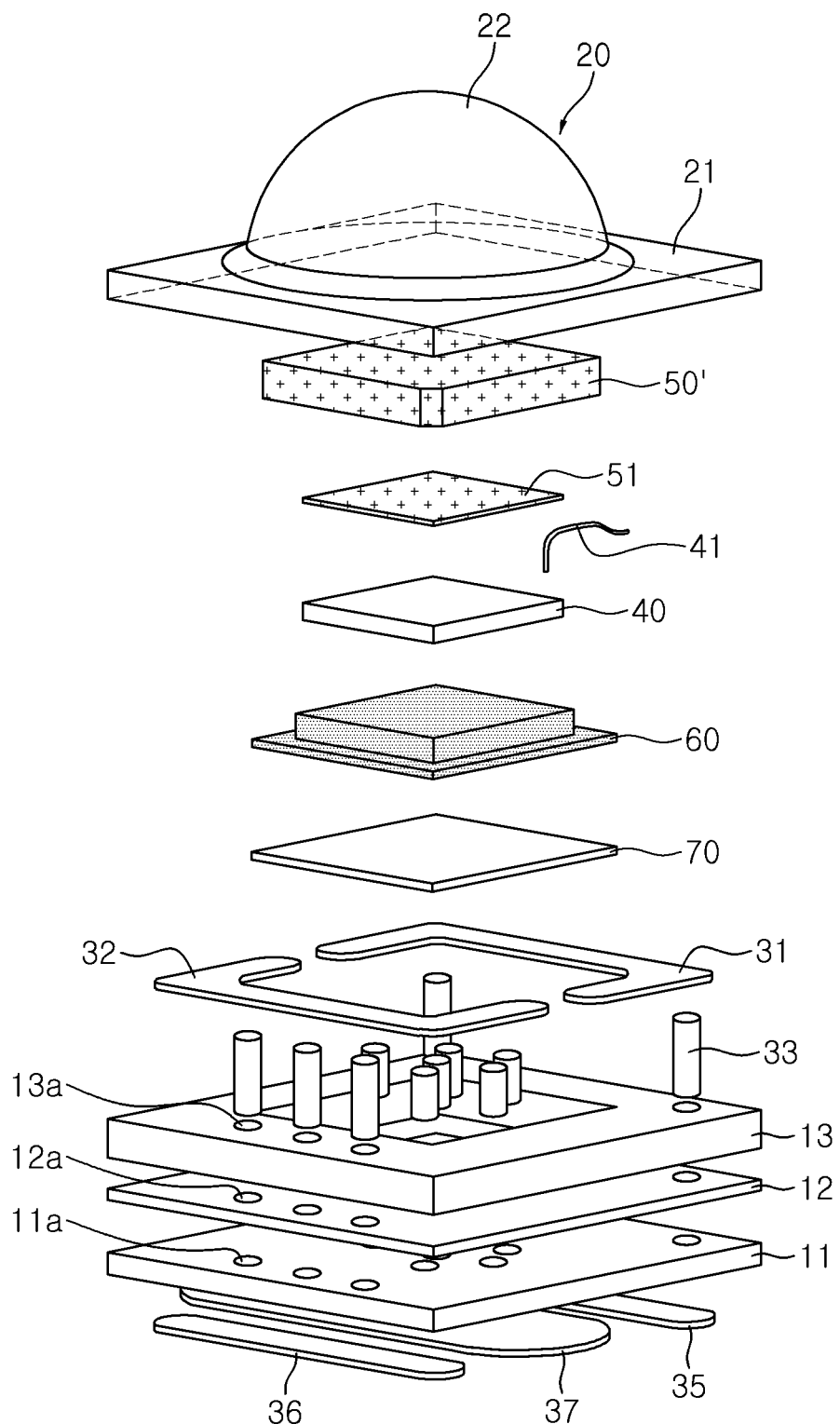
FIG. 7 is an exploded perspective view of FIG. 6.
Figure 8:
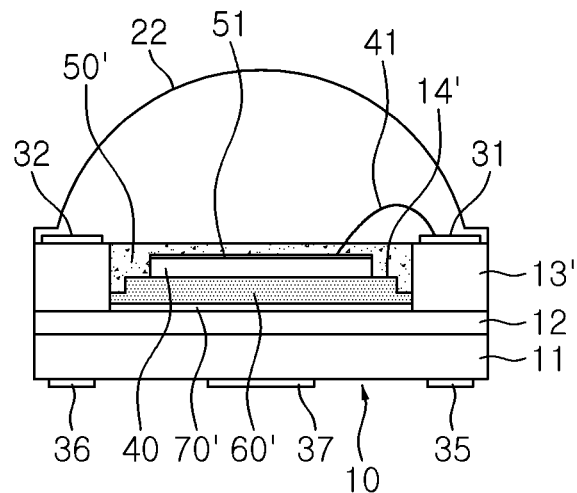
FIG. 8 is a cross-sectional view of FIG. 6.
Figure 9:
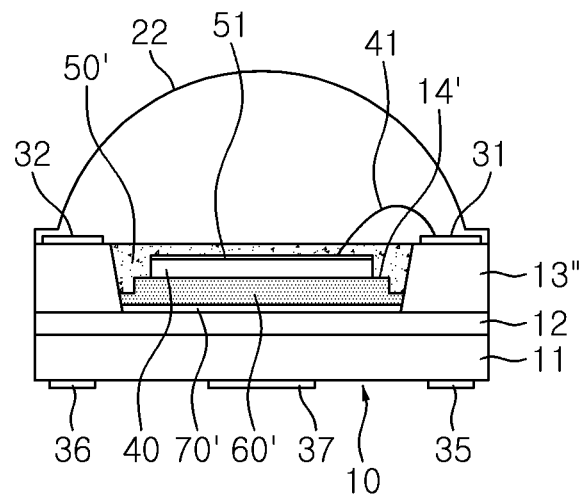
FIG. 9 is a cross-sectional view showing a light emitting device package according to another embodiment of the present invention.

FIGS. 6 through 8 illustrate a light emitting device package according to another embodiment of the invention. In the light emitting device package according to this embodiment, a cavity 14' has a quadrangular shape, while a heat sink 60', a heat conductive layer 70', and a phosphor layer 50' provided within the cavity 14' also have quadrangular shapes correspondingly thereto.

The inner wall of the cavity 14' may be vertical, or may be inclined as shown in FIG. 8 such that it may effectively adjust the amount of light reflected forward and dispersed laterally considering that alighting area of the light emitted from the light emitting device 40 is changed according to the inclination degree of the inner wall of the cavity 14'.

The inclination degree of the inner wall of the cavity 14' may be changed within various ranges, considering the characteristics of the light emitting device 40, the orientation angle of light, and the like, that is, it may be selected to demonstrate desired light characteristics according to the intended use of products.

The inclination degree of the inner wall of the cavity 14' may be 30° to 60°, and more preferably, 45°.

Here, a reflective layer, such as a coating film (not shown) formed of a metal such as aluminum or the like, may be further formed on the inner wall of the cavity 14 such that reflectivity of light transmitted to the light emitting device 40 may be further enhanced.

Figure 10:
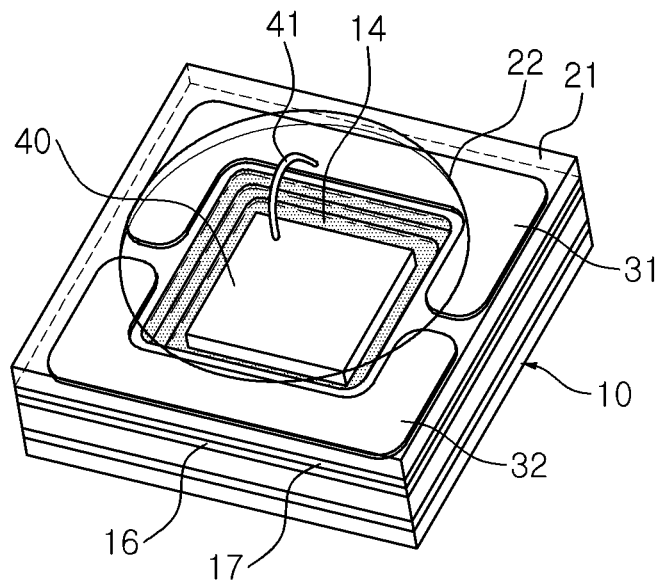
FIG. 10 is a schematic perspective view showing a light emitting device package according to another embodiment of the present invention.
Figure 11:
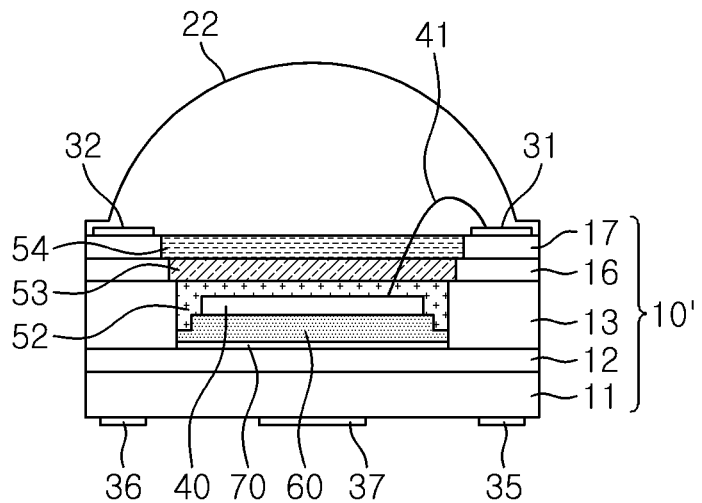
FIG. 11 is a cross-sectional view of FIG. 10.
Figure 12:
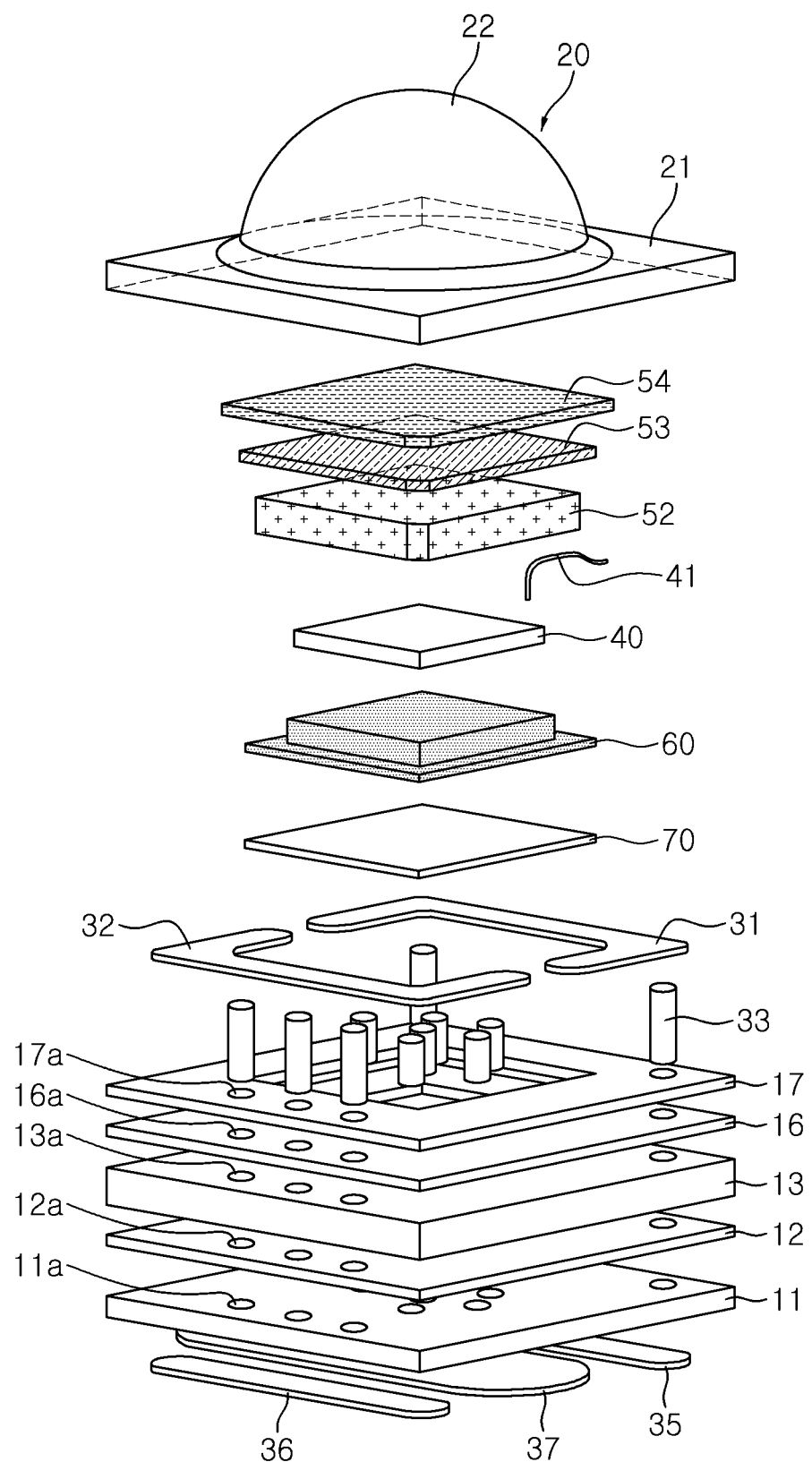
FIG. 12 is an exploded perspective view of FIG. 10.

FIGS. 10 through 12 illustrate a light emitting device package according to another embodiment of the invention. The light emitting device package according to this embodiment may have a multilayer structure in which the substrate 10 includes a plurality of sub-substrates 13, 16 and 17 having central hole portions whose diameters gradually increase in an upward direction, such that the cavity 14 has a stepped multilayer structure. Meanwhile, a detailed description of the same components as described in the previous embodiment will be omitted.

The individual layers within the cavity 14 may be different colored phosphor layers 52, 53 and 54, each of which is selected from a red phosphor layer, a green phosphor layer, an orange phosphor layer or a yellow phosphor layer. Alternatively, two or more identically colored phosphor layers may be repeatedly formed. If necessary, a single phosphor layer may be formed by mixing phosphor materials having a plurality of colors.

As described above, in a case in which the individual sub-substrates 13, 16 and 17 have different colored phosphor layers formed therein, light speed and color rendering index (CRI) may be enhanced.

The yellow phosphor layer may be formed of a phosphor material selected from a YAG-based phosphor, a TAG-based phosphor, or a silicate-based phosphor ($Sr_2SiO_1$:Eu); however, the invention is not limited thereto.

Here, the individual phosphor layers 52, 53 and 54 may further include a diffusion material in order to smoothly diffuse light, in addition to the phosphor material for the wavelength conversion of light emitted from the light emitting device 40.

Further, the phosphor layers 53 and 54 stacked on the phosphor layer 52 covering the light emitting device 40 may be formed as films in order to facilitate the manufacturing thereof.

Figure 13:
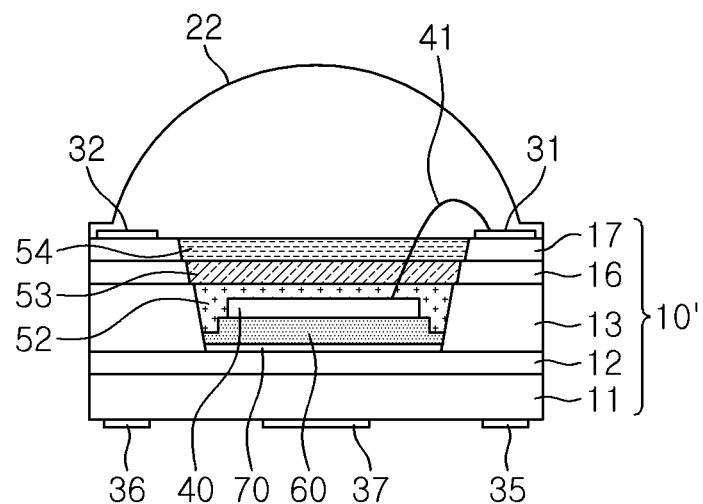
FIG. 13 is a cross-sectional view showing a light emitting device package according to another embodiment of the present invention.
Figure 14:
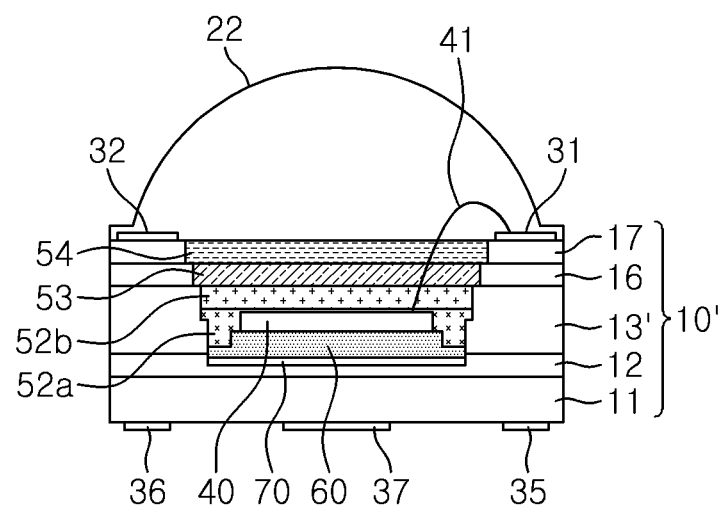
FIG. 14 is a cross-sectional view showing a light emitting device package according to another embodiment of the present invention.

The inner wall of the cavity 14 may be inclined at various angles as shown in FIGS. 13 and 14 such that the amount of light reflected forward and dispersed laterally may be effectively adjusted, considering that a lighting area of the light emitted from the light emitting device 40 is changed according to the inclination degree of the inner wall of the cavity 14. Here, the inner wall of the cavity 14 may be formed such that the individual sub-substrates 13, 16 and 17 have different angles of inclination.

Figure 15:
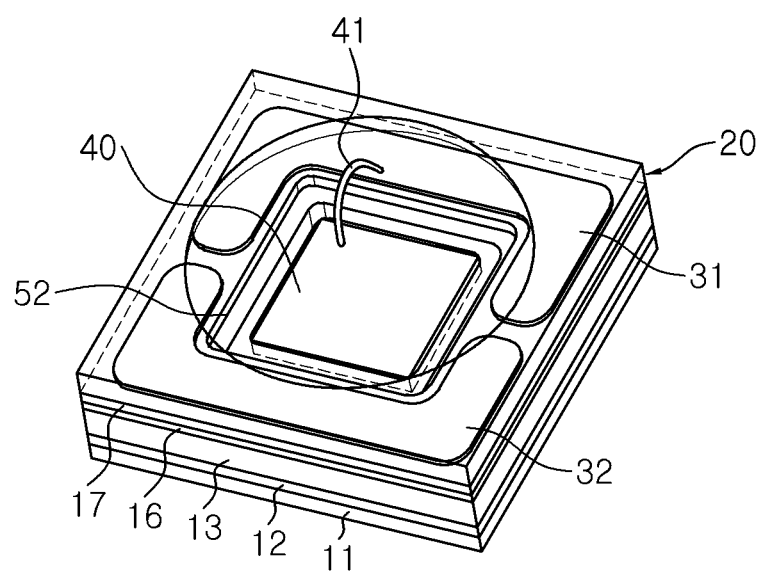
FIG. 15 is a schematic perspective view showing a light emitting device package according to another embodiment of the present invention.
Figure 16:
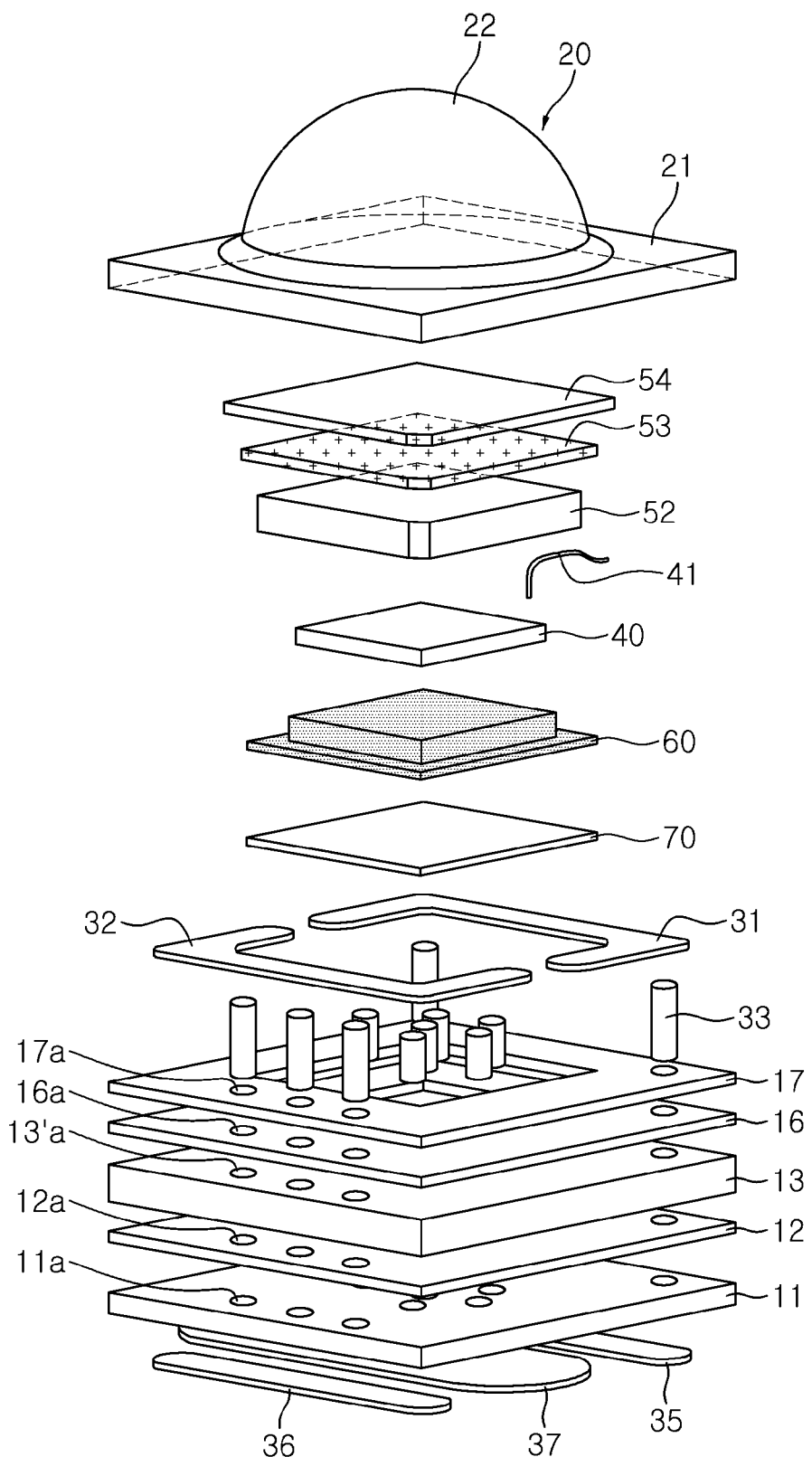
FIG. 16 is an exploded perspective view of FIG. 15.
Figure 17:
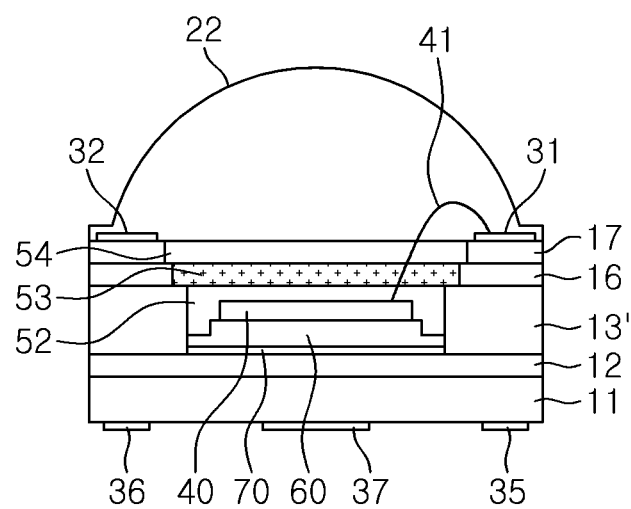
FIG. 17 is a cross-sectional view of FIG. 15.

With reference to FIGS. 15 through 17, prior to the forming of the phosphor layer, a transparent resin part having superior light transmissivity may be formed to encapsulate the light emitting device 40 in order to improve external light extraction efficiency by protecting the light emitting device 40 and allowing for refraction index matching of the light emitting device 40 with the outside.

For example, the upper and lower layers within the cavity may be formed as the transparent resin parts 52 and 54 and the intermediate layer may be formed as the phosphor layer 53.

Here, the thickness of the phosphor layer 53 may be 100 µm or less allowing for optimum light efficiency, taking the refraction index of light into consideration.

The transparent resin parts 52 and 54 may be formed of a highly transparent resin, such as silicone, epoxy, or silica, such that they allow light produced from the light emitting device 40 to pass therethrough while minimizing light loss.

Also, the transparent resin parts 52 and 54 may include a phosphor material in order to convert monochromatic light to white light or the like by the wavelength conversion of the light emitted from the light emitting device 40.

In addition, the transparent resin parts 52 and 54 may further include an ultraviolet absorbent in order to absorb ultraviolet rays emitted from the light emitting device 40.

A method of manufacturing the light emitting device package having the above-described configuration will be described with reference to FIGS. 1 through 3.

First of all, the cavity 14 is formed within the substrate 10. The cavity 14 may be formed in the upper surface of the substrate 10 by a hole making process such as drilling or by stacking ceramic layers having central hole portions on a flat ceramic layer.

In the case of the hole making process using drilling, the cavity 14 usually has a circular shape. In the case of the stacking of the ceramic layers, the cavity 14' may have various shapes such as a square shape, a quadrangular shape or the like corresponding to the shapes of the central hole portions as shown in FIG. 6.

Thereafter, the heat conductive layer 70 may be disposed on the bottom surface of the cavity 14, and the heat sink 60 may be disposed on the heat conductive layer 70 by being inserted into the cavity 14 to be adjacent to the inner wall of the cavity 14.

The heat sink 60 is manufactured in advance by a molding process. Here, the heat sink 60 may be manufactured to have a structure including the flange part 61 having an upwardly inclined edge and the heat transfer part 62 protruding upwardly in the central portion of the flange part 61 by a predetermined height. After being disposed on the bottom surface of the cavity 14, the heat sink 60 may be pressed to be extended, such that it may be fixedly attached to the inner wall of the cavity 14.

Here, a space may be formed between the inner wall of the cavity 14 and the outer wall of the heat transfer part 62, and a phosphor material or a transparent resin is injected into the space, such that the coupling strength of the substrate 10 and the heat sink 60 is increased to thereby improve reliability.

Further, the height of the heat transfer part 62 is adjusted to thereby adjust the orientation angle of light emitted from the light emitting device 40. That is, using the fact that the orientation angle is changed by approximately 3° when the height of the heat transfer part 62 is increased by 50 µm, the height of the heat transfer part 62 may be appropriately adjusted to manufacture the heat sink 60 having a desired orientation angle.

Then, the light emitting device 40 is disposed on the upper surface of the heat transfer part 62 of the heat sink 60, and a phosphor material is dispensed within the cavity 14 to form the phosphor layer 50 while covering the heat sink 60 and the light emitting device 40, and thus a light emitting device package is formed.

Here, in the case in which the light emitting device 40 is a blue LED chip, after a first phosphor material 51 is applied over the blue LED chip by a chip label coating, a second phosphor material 50' may be dispensed to cover the heat sink 60 and the blue LED chip within the cavity 14 so as to solve color coordinate errors and allow for conversion into different color coordinates. The second phosphor material may have an identical or a different color to that of the first phosphor material according to necessity.

In a case in which the light emitting device 40 is a white LED chip according to another embodiment, a phosphor material is dispensed within the cavity 14 such that a color temperature of light emitted from the white LED chip may be converted.

According to another embodiment with reference to FIGS. 10 through 12, the cavity 14 may have a stepped multilayer structure by stacking the plurality of sub-substrates 13, 16 and 17 having central hole portions, whose diameters gradually increase in an upward direction, on a flat sub-substrate 12.

The phosphor layers may be formed by dispensing a phosphor material to the individual sub-substrates 13, 16 and 17 stepped within the cavity 14 or may be formed by coating phosphor films formed of a phosphor material on the individual sub-substrates.

In order to improve manufacturing efficiency and form phosphor layers having a uniform thickness, the phosphor layer 52 covering the light emitting device 40 may be formed by the dispensing of the phosphor material, and the phosphor layers 53 and 54 stacked thereon may be formed by the coating of the phosphor films.

Here, the same colored phosphor layers or different colored phosphor layers may be formed in the individual sub-substrates 13, 16 and 17, or a single phosphor layer may be formed by mixing a plurality of phosphor materials.

Meanwhile, a transparent resin part may be further formed. In a case in which the cavity is formed by stacking two sub-substrates having stepped central hole portions, the lower layer is formed by dispensing the transparent resin part to cover the heat sink and the light emitting device and the upper layer is formed by dispensing or coating the phosphor layer to cover the transparent resin part.

In a case in which the cavity has the three layers therein as shown in FIGS. 15 through 17, a first transparent resin part 52 is formed in the lower sub-substrate 13 by dispensing a transparent resin therein, and the phosphor layer 53 is formed thereon to cover the first transparent resin part 52, and then a second transparent resin part 54 is formed thereon to cover the phosphor layer 53. Here, the phosphor layer 53 may be formed to be 100 µm or less by dispensing a phosphor material.

The phosphor layer 53 may be formed by selectively stacking a red phosphor layer or a green phosphor layer in the individual stepped sub-substrates. Thereafter, the lens unit 20 may be provided on the substrate.

As set forth above, according to embodiments of the invention, a light emitting device package may be easily manufactured by including a substrate having a cavity therein and phosphor layers within the cavity, the phosphor layers of a desired thickness having superior uniformity, whereby the manufacturing time and costs thereof may be reduced and color deviation in light emitted from a light emitting device may be reduced to thereby improve reliability.

The cavity has a stepped multilayer structure and red, green and yellow phosphor materials are respectively provided in the individual layers of the cavity, whereby light speed and CRI may be improved.

The cavity having the stepped multilayer structure has a film-type phosphor layer in the upper layer thereof, whereby CCT may be improved.

In the substrate having the cavity therein, the phosphor layer within the cavity is formed as a thin film, whereby the manufacturing of the package may be facilitated. The manufacturing costs thereof may be reduced, and color temperature distribution may be reduced to thereby improve reliability.

In the cavity having the stepped multilayer structure, a transparent resin part is formed in a lower portion of the cavity and a phosphor layer is formed thereon such that the phosphor layer, sensitive to heat, is spaced apart from heat generated in the light emitting device. The influence of thermal characteristics, i.e., temperature change and heat generated in the light emitting device, on color coordinates may be minimized to thereby improve reliability.

The position of the light emitting device within the cavity is adjusted by controlling the height of a heat transfer part of a heat sink, whereby the orientation angle of light emitted from the light emitting device may be easily adjusted.

While the present invention has been shown and described in connection with the embodiments, it will be apparent to those skilled in the art that modifications and variations can be made without departing from the spirit and scope of the invention as defined by the appended claims.

What is claimed is:

1. A light emitting device package, comprising:
   a substrate having a cavity defined therein;
   a heat sink disposed in the cavity;
   a light emitting device disposed on the heat sink; and
   a phosphor layer disposed within the cavity and covering the light emitting device, wherein:
   the substrate comprises a plurality of stacked sub-sub-strates, the cavity is defined by at least one ceramic sub-substrate of the sub-substrates having a central hole portion,
   at least one electrode bar penetrates the at least one ceramic sub-substrate to electrically contact with an electrode of the substrate,
   the heat sink is disposed on a bottom surface of the cavity, and
   the heat sink includes a flange part and a heat transfer part such that the flange part is attached to a surface of an inner wall of the cavity and a space is defined above the flange part and between the heat transfer part and said surface of the inner wall of the cavity.

2. The light emitting device package of claim 1, wherein the cavity has a stepped multilayer structure which is defined by an inner wall of the cavity shaped as a plurality of steps.

3. The light emitting device package of claim 1, wherein:
   the flange part has an edge upwardly inclined to be fixedly attached to the inner wall of the cavity, and
   the heat transfer part protrudes upwardly from a central portion of the flange part.

4. The light emitting device package of claim 1, wherein the phosphor layer includes a mixed plurality of phosphor materials.

5. The light emitting device package of claim 1, wherein the phosphor layer comprises at least one film-type phosphor layer.

6. The light emitting device package of claim 1, wherein the cavity has a quadrangular shape or a circular shape.

7. The light emitting device package of claim 1, wherein the inner wall of the cavity is inclined.

8. The light emitting device package of claim 1, wherein the inner wall of the cavity is formed as a light reflective surface.

9. The light emitting device package of claim 1, wherein the light emitting device includes at least one of a white LED chip, a red LED chip, a green LED chip and a blue LED chip.

10. The light emitting device package of claim 1, further comprising a heat conductive layer between the heat sink and the bottom surface of the cavity.

11. The light emitting device package of claim 1, further comprising:
    a plurality of via holes defined in the substrate in a vertical direction to communicate with the electrode; and
    a plurality of electrode bars disposed in the respective via holes to make electrical connections with a plurality of the electrodes.

12. The light emitting device package of claim 1, further comprising a lens unit provided on the substrate.

13. The light emitting device package of claim 1, wherein the cavity is defined by the sub-substrates having different sizes of central hole portions.

14. The light emitting device package of claim 2, wherein different colored phosphor layers are on each of the plurality of steps.

15. The light emitting device package of claim 2, wherein the cavity has two stepped layers,
    a transparent resin part is provided in a lower layer of the two stepped layers while covering the heat sink and the light emitting device, and
    a phosphor layer is provided in an upper layer of the two stepped layers while covering the transparent resin part.

16. The light emitting device package of claim 2, wherein the cavity has three stepped layers,
    a transparent resin part is provided in upper and lower layers of the three stepped layers, and
    a phosphor layer is provided in an intermediate layer of the three stepped layers.

17. The light emitting device package of claim 2, wherein the inner wall of the cavity has different angles of inclination in each of the plurality of steps.

18. The light emitting device package of claim 14, wherein the different colored phosphor layers comprise at least three layers selected from the group including a red phosphor layer, a green phosphor layer and a yellow phosphor layer.

19. The light emitting device package of claim 16, wherein the phosphor layer has a thickness of 100 μm or less.

20. A light emitting device package, comprising:
    a substrate having a cavity defined therein;
    a heat sink disposed in the cavity;
    a light emitting device disposed on the heat sink; and
    a phosphor layer disposed within the cavity and covering the light emitting device, wherein:
    the substrate comprises a plurality of stacked sub-sub-strates,
    the cavity is defined by at least one ceramic sub-substrate of the sub-substrates having a central hole portion,
    at least one electrode bar penetrates the at least one ceramic sub-substrate to electrically contact with an electrode of the substrate,
    wherein the heat sink and the inner wall of the cavity have a space therebetween, and the space has a transparent resin part therein.

21. A light emitting device package, comprising:
    a substrate having a cavity defined therein;
    a heat sink disposed in the cavity;
    a light emitting device disposed on the heat sink; and
    a phosphor layer disposed within the cavity and covering the light emitting device, wherein:
    the substrate comprises a plurality of stacked sub-sub-strates,
    the cavity is defined by at least one ceramic sub-substrate of the sub-substrates having a central hole portion,
    at least one electrode bar penetrates the at least one ceramic sub-substrate to electrically contact with an electrode of the substrate, wherein the heat sink and the inner wall of the cavity have a space therebetween, and
the space has a phosphor layer therein.

* * * * *